(12) United States Patent
Moriya et al.

(10) Patent No.: US 7,619,355 B2
(45) Date of Patent: Nov. 17, 2009

(54) ELECTRON SOURCE, IMAGE DISPLAY APPARATUS, IMAGE REPRODUCING APPARATUS, WIRING BOARD, AND MANUFACTURING METHOD OF WIRING BOARD

(75) Inventors: Masafumi Moriya, Hiratsuka (JP); Kazuya Ishiwata, Yokosuka (JP)

(73) Assignee: Canon Kabushiki Kaisha, Tokyo (JP)

( * ) Notice: Subject to any disclaimer, the term of this patent is extended or adjusted under 35 U.S.C. 154(b) by 385 days.

(21) Appl. No.: 11/766,147

(22) Filed: Jun. 21, 2007

(65) Prior Publication Data

US 2008/0001516 A1 Jan. 3, 2008

(30) Foreign Application Priority Data

Jul. 3, 2006 (JP) ............................. 2006-183699

(51) Int. Cl.
*H01J 1/62* (2006.01)
*H01J 9/00* (2006.01)

(52) U.S. Cl. ......................................... 313/495; 445/23

(58) Field of Classification Search ................. 313/495, 313/498, 506, 511
See application file for complete search history.

(56) References Cited

U.S. PATENT DOCUMENTS

| | | | |
|---|---|---|---|
| 6,653,232 B2 | 11/2003 | Uda et al. ................... 438/669 |
| 6,758,712 B2 | 7/2004 | Kubo et al. ................... 445/24 |
| 6,803,707 B2 | 10/2004 | Ishiwata et al. ............. 313/310 |
| 6,815,884 B2 | 11/2004 | Yamada et al. .............. 313/495 |
| 6,853,117 B2 | 2/2005 | Toshima et al. ............. 313/304 |
| 6,866,989 B2 | 3/2005 | Watanabe et al. ............ 430/394 |
| 6,902,455 B2 | 6/2005 | Yanagisawa et al. .......... 445/24 |
| 6,903,504 B2 | 6/2005 | Watanabe et al. ........... 313/495 |
| 7,095,168 B2 | 8/2006 | Meguro et al. .............. 313/495 |
| 7,211,943 B2 | 5/2007 | Watanabe et al. ........... 313/495 |
| 7,285,428 B2 | 10/2007 | Uda et al. ....................... 438/4 |
| 7,318,996 B2 | 1/2008 | Watanabe et al. ........... 430/311 |
| 2001/0017221 A1* | 8/2001 | Horiuchi et al. ............. 174/260 |
| 2005/0148269 A1 | 7/2005 | Uda et al. ....................... 445/6 |
| 2006/0194156 A1 | 8/2006 | Watanabe et al. ........... 430/394 |
| 2007/0262705 A1* | 11/2007 | Fukuda et al. ............... 313/504 |
| 2008/0001517 A1 | 1/2008 | Moriya et al. ............... 313/483 |
| 2008/0005899 A1 | 1/2008 | Moriya et al. ................. 29/831 |

FOREIGN PATENT DOCUMENTS

| | | |
|---|---|---|
| JP | 50-107858 | 8/1975 |
| JP | 5-81938 | 4/1993 |
| JP | 10-91097 | 4/1998 |
| JP | 11-312481 | 11/1999 |
| JP | 2000-019982 | 1/2000 |
| JP | 2001-189142 | 7/2001 |
| JP | 2004-342547 | 12/2004 |
| JP | 2005-216639 | 8/2005 |

* cited by examiner

*Primary Examiner*—Toan Ton
*Assistant Examiner*—Brenitra M Lee
(74) *Attorney, Agent, or Firm*—Fitzpatrick, Cella, Harper & Scinto

(57) ABSTRACT

To provide an electron source including: a wiring board having: a substrate having a groove on its surface; a conductive wire containing a metal which is arranged along the groove in the groove; and a wiring which is arranged above the wire crossing the wire; and an electron-emitting device which is arranged on the wiring board and is electrically connected to the conductive wire and the wiring; wherein the wire has an oxide layer of the metal contained in the wire on its surface.

14 Claims, 13 Drawing Sheets

ELECTRON SOURCE, IMAGE DISPLAY APPARATUS, IMAGE REPRODUCING APPARATUS, WIRING BOARD, AND MANUFACTURING METHOD OF WIRING BOARD

BACKGROUND OF THE INVENTION

1. Field of the Invention

The present invention relates to an electron source, an image display apparatus, an image reproducing apparatus, a wiring board, and a manufacturing method of a wiring board.

2. Description of the Related Art

A flat panel display such as a liquid crystal display (LCD), a plasma display (PDP), and a field emission display (FED) is a display apparatus having a plurality of pixels arranged in a planar state. By selectively applying a voltage to an electron-emitting device located on each cross portion of a plurality of wirings (matrix wirings) arranged in a matrix or in the vicinity of each cross portion thereof, a flat panel display using an electron-emitting device controls emission of the electron from each electron-emitting device and displays an image.

The matrix wiring is formed by a scan line to which a scan signal is applied and a signal line to which a modulation signal is applied. In recent years, there is a great demand for a display which can display a high-resolution image. Therefore, it is necessary for the wiring to be made narrower, and on the other hand, it is necessary for the film of the wiring to be thick in order to prevent increase of resistance of the wiring due to narrowing of the wiring. In addition, a display which can be made more simply has been required.

As one of solutions for such a request, it is disclosed in Japanese Patent Application Laid-Open No. 2005-216639 and Japanese Patent Application Laid-Open No. 2004-342547 to put a metal which has been prepared in advance in a groove disposed on the surface of a substrate and use this for the wiring.

SUMMARY OF THE INVENTION

According to the methods disclosed in the above-described documents, a resistance value of the wire itself may be changed over time. For example, as an example of change over time, change of the resistance value of the wire itself when gas and a wire material left in an atmosphere in a manufacturing process and during driving react with each other may be considered. Particularly, in the manufacturing process, the resistance value of the wire itself may be changed by repeating rising in temperature and fall in temperature. In addition, it is necessary to form an insulating material of a glass paste between the scan line and the signal line according to a printing method or the like in order to insulate the scan line from the signal line, so that this involves a problem such that a manufacturing cost is raised.

(1) An electron source according to the present invention has been made in order to solve the above-described problem and it includes an electron source including: a wiring board including: a substrate having a groove on its surface; a conductive wire containing a metal which is arranged along the groove in the groove; and a wiring which is arranged above the wire crossing the wire; and an electron-emitting device which is arranged on the wiring board and is electrically connected to the conductive wire and the wiring; wherein the wire has an oxide layer of the metal contained in the wire on its surface.

(2) In addition, the present invention provides an image display apparatus including: the electron source according to (1); and a light-emitting member for emitting a light by irradiation with electrons emitted from the electron source.

(3) In addition, the present invention provides an image reproducing apparatus including: the image display apparatus according to (2); and a receiver, which is connected to the image display apparatus, for receiving at least one of a broadcast signal and a signal transmitted via an electric communication line.

(4) In addition, the present invention provides a wiring board including: a substrate having a groove on its surface; a conductive wire containing a metal which is arranged along the groove in the groove; and a wiring which is arranged above the wire crossing the wire; wherein the wire has an oxide layer of the metal contained in the wire on its surface, and the oxide layer is arranged at least between the wiring and the wire and between the wire and an inner wall of the groove.

(5) In addition, the present invention provides a manufacturing method of a wiring board, comprising the steps of: preparing a substrate having a groove on its surface; preparing a wire made of a metal, of which surface is oxidized; and arranging the wire along the groove in the groove.

(6) In addition, the present invention provides a manufacturing method of a wiring board, comprising the steps of: preparing a substrate having a groove on its surface; arranging a wire made of a metal along the groove and in the groove; and oxidizing the surface of the wire.

According to the present invention, it is possible to provide a wiring board of an electrically stable structure, which can prevent change of a resistance value or the like.

DESCRIPTION OF THE EMBODIMENTS

Figure 1:
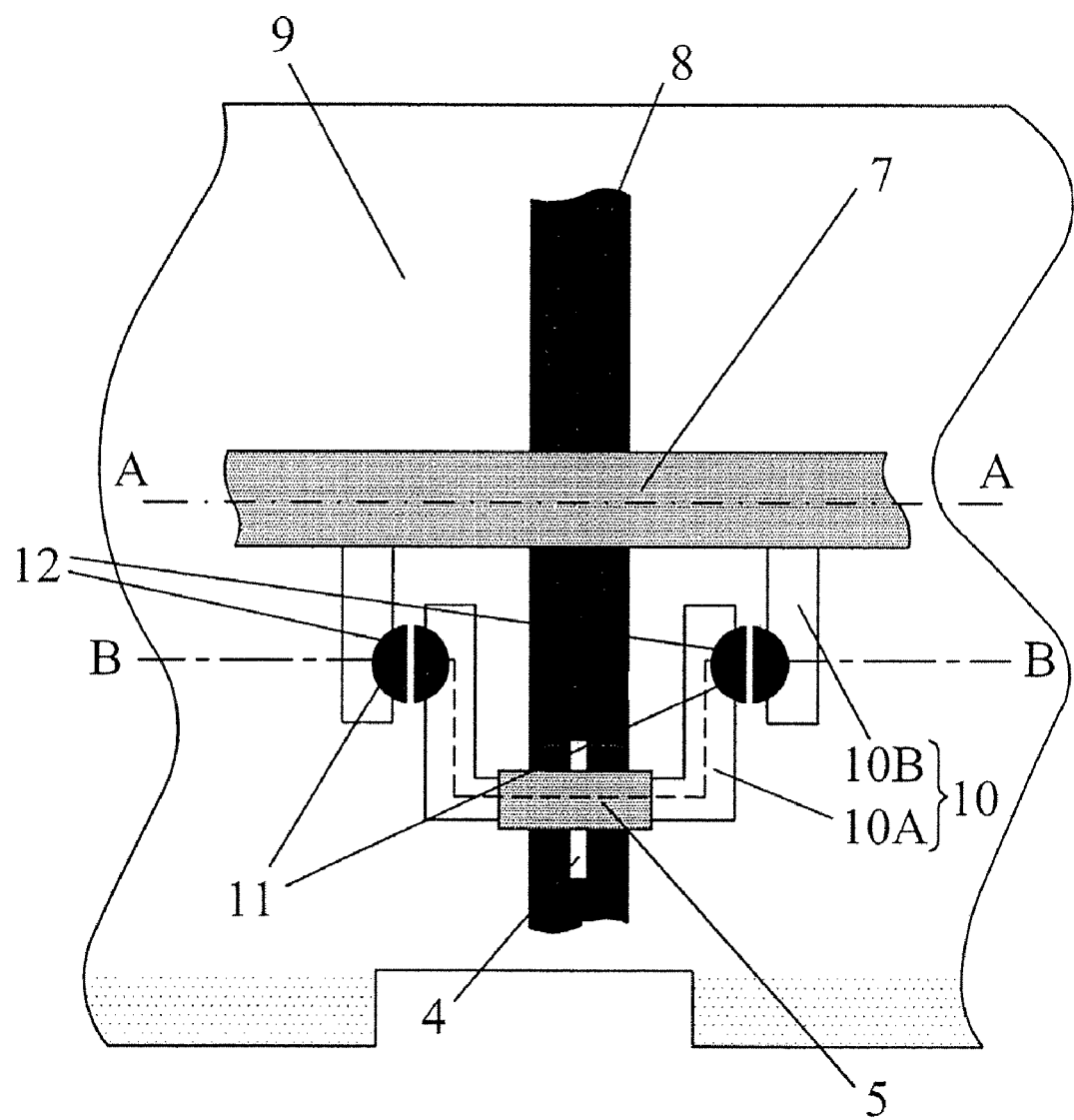
FIG. 1 is a plan pattern diagram of a matrix wiring structure according to a second embodiment.

Preferred embodiments of the present invention will be described in detail below with reference to the drawings. However, the scope of the present invention is not limited to measurements, materials, shapes, and their relative positions or the like of constituent parts described in the present embodiment unless particularly described.

According to the embodiment described below, taking an example of arranging a surface conduction electron-emitting device on a wiring board as an electron-emitting device, namely, an example of a substrate of an electron source, the present invention will be described. The surface conduction electron-emitting device is formed by a conductive film having a gap and a pair of electrodes connected to the opposite ends of this conductive film. However, an electron-emitting device having at least two electrodes such as a field emission type electron-emitting device and a metal-insulator-metal type electron-emitting device can be preferably applied as an electron-emitting device used for an electron source of the present invention. In addition, the wiring board of the present invention (the substrate provided with the wiring) can be used for a substrate of various displays including a liquid crystal display, an organic EL display, and a plasma display. In other words, if a functional device (an electronic device) provided with at least two terminals such as the above-described electron-emitting device, an EL device, and a TFT is connected to a wiring (composed of a wiring 7 and a wire 3 covered with an oxide coating 8) arranged in a matrix shown in FIG. 7 or the like, various electronic devices such as a display can be configured.

According to the present embodiment, an example that a wiring board provided with a wire having its surface which is covered with an oxide coating (equivalent to "an oxide layer" of the present invention) made of an oxide is applied to an electron source will be described. Further, as a wire covered with the oxide coating according to the present invention, a wire having an oxide coating as other member than that of the wire on its surface and a wire of which surface is oxidized (namely, a wire that a wire itself has a surface oxide coating) can be applied. Further, an oxidation degree thereof is easily changed step by step from the surface of the wire toward the center of the wire in the wire formed by oxidizing the surface of the wire. Therefore, the configuration that the wire itself has the surface oxide coating may include "the configuration that the wire and the oxide coating do not have a clear boundary" or "the wire having the surface oxide coating". Further, the "wire" does not mean a wiring which is directly formed (molded) on the substrate by accumulating the wiring material on the substrate according to a spatter method, an application method or the like but it means a wiring which has been formed in advance on other place (the place other than on the substrate), and typically, the "wire" means a member such as a metallic wire.

First Embodiment

Figure 7:
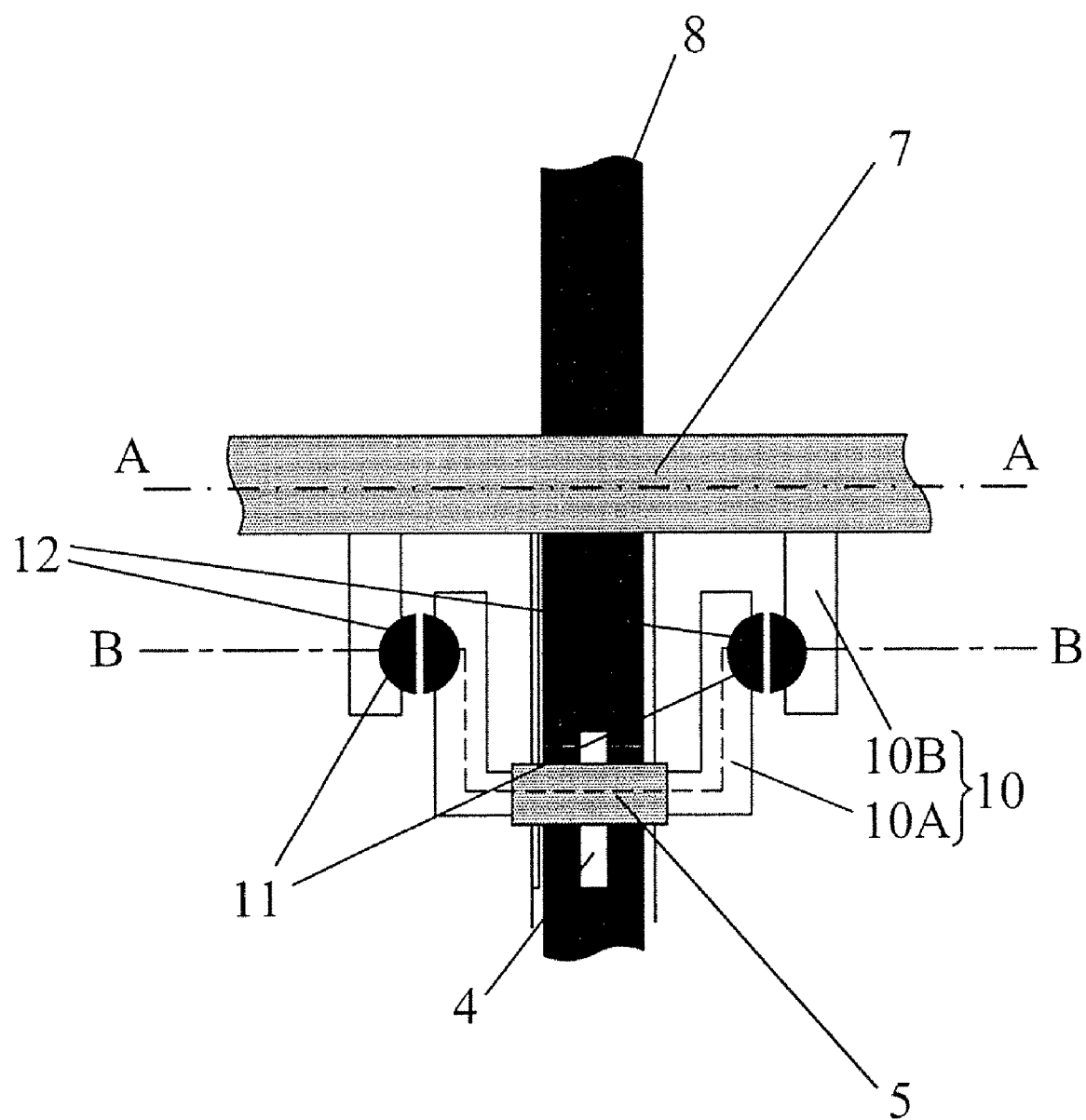
FIG. 7 is a plan pattern diagram of other matrix wiring structure according to the first embodiment.
Figure 8:
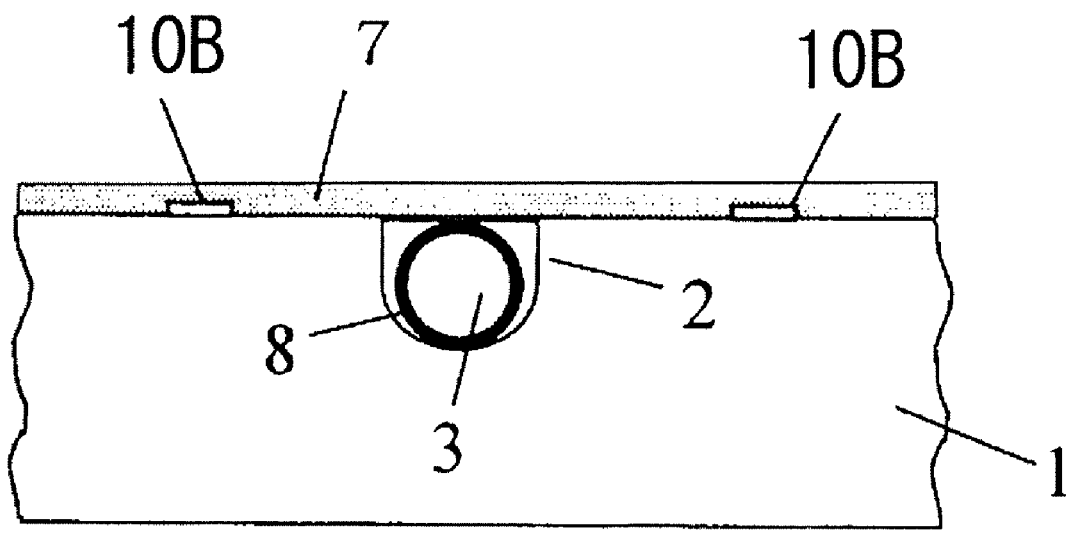
FIG. 8 is a sectional pattern diagram of the matrix wiring structure shown in FIG. 7.
Figure 9:
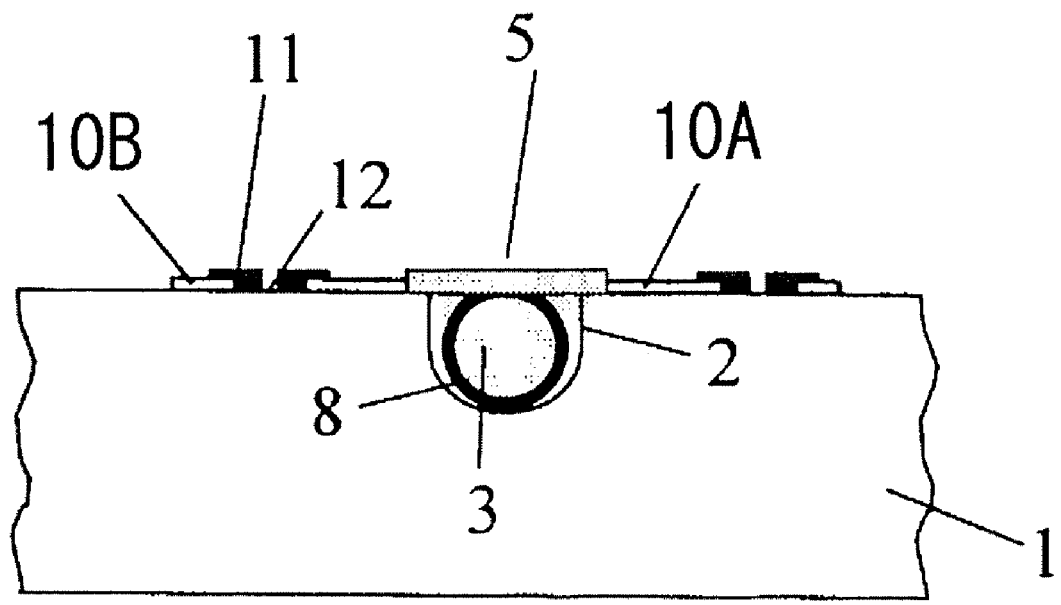
FIG. 9 is a sectional pattern diagram of the matrix wiring structure shown in FIG. 7.

FIG. 7 is a plan pattern diagram of a matrix wiring structure according to the present embodiment. In this example, the electron-emitting device is disposed on the wiring board. FIG. 8 is a sectional pattern diagram of the matrix wiring structure taken on a line A-A shown in FIG. 7, and FIG. 9 is a sectional pattern diagram of the matrix wiring structure taken on a line B-B shown in FIG. 7.

<Wiring Board>

The wiring board includes at least a substrate 1 provided with a groove 2 and a conductive wire 3 containing a metal that at least a part thereof is arranged in the groove 2 along the groove 2. The wire 3 has an oxide layer (an oxide coating 8) of the metal contained in the wire 3 on its surface. Then, according to the embodiment to be described below, the wiring board is further provided with an opening (it may be also referred to as a ground portion or a contact portion) 4 which is disposed on a part of the oxide coating 8 of the wire 3, a first electrode 5 which is connected to the wire through the opening 4, a wiring 7 arranged so as to cross the wire, and an electrode pair 10 formed by a second electrode 10A and a third electrode 10B. Between the electrode pair 10, a conductive film 11 having a gap 12 is disposed. From this conductive film 11, an electron is emitted.

As a material of the substrate 1, a glass is preferable. The wire 3 containing a metal is preferably a wire of which main component is a metal. A metal is selected from any one of Cu, Al, and Ni. Further, the wire is preferably formed by the wire 3 made of oxygen-free copper. If the wire is made of an oxygen-free copper, a degree of oxidation can be controlled. The surface of the wire 3 is covered with the oxide coating 8 which is an oxide of a material contained in the wire 3. The oxide coating 8 is an insulating layer which is disposed on the surface of the wire 3 and it is preferable that this insulating layer is an oxide layer, which is configured by oxidizing a part of the wire 3. The oxide coating 8 is disposed at least between the wiring 7 and the wire 3, and between the wire 3 and the inner wall of the groove 2. By covering the wire 3 with the oxide coating, it is possible to prevent change of the resistance value of the wire itself, for example, due to reaction of wire material and gas left in an atmosphere in a manufacturing process and during driving of the wire 3. This oxide coating can be referred to as a passivation layer or a passivation film, and the processing for forming the oxide coating on the surface of the wire 3 can be referred to as a surface passivation treatment. As the shape of the wire 3 containing a metal, a circle section or a rectangular section is used, however, it is not particularly limited. The wire with a circle section can be easily obtained and particularly, this can be preferably applied because a wire rod which is commercially available as a bonding material for an IC or the like in general and a wire rod for an enamel wire can be used. In the case of using a wire of a predetermined measurement, a wire made of a publicly-known drawing machine may be used.

The first electrode 5 is an electrode (a connection pad) for connecting the wire 3 to the second electrode 10A of the electrode pair 10. The first electrode 5 is connected to the ground portion 4 (the contact portion), which is a portion not covered with the oxide coating 8 on the surface of the wire 3. The electrode pair 10 is a pair of electrodes for composing the surface conduction electron-emitting device and the electrode pair 10 is located in the vicinity of the groove 2 and on the surface of the substrate 1.

Figure 12:
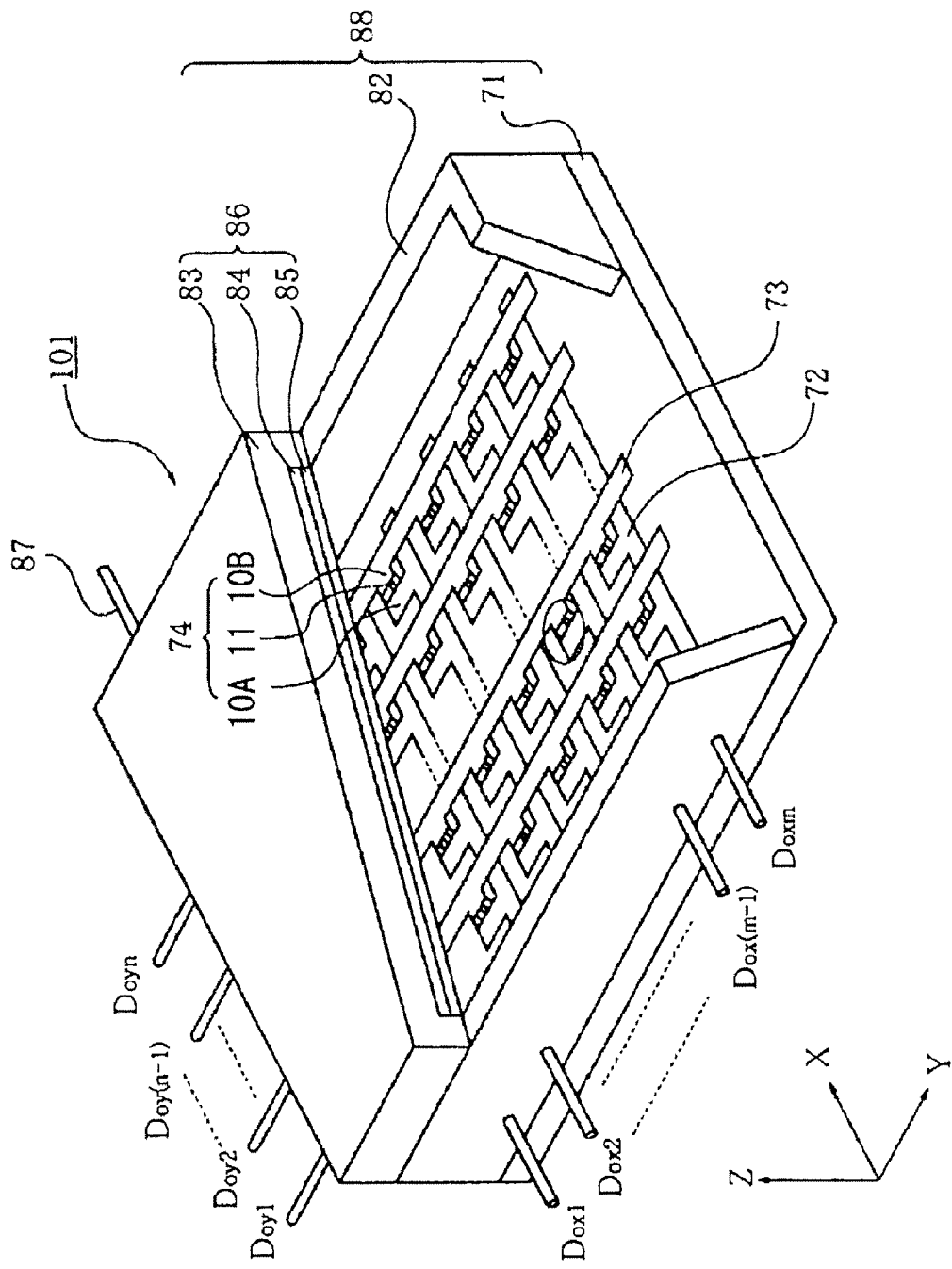
FIG. 12 is a pattern diagram of an image display apparatus according to the embodiment of the present invention.

The wiring 7 is arranged above the wire 3 so as to cross the wire 3. In the case of configuring a matrix wiring with a plurality of wirings 7 and a plurality of wires 3, for example, as shown in FIG. 12, a plurality of Y-directional wirings 73 (the wiring 7) is arranged above each of X-directional wirings 72 (the wire 3). By covering a part of the third electrode 10B arranged on the surface of the substrate 1, the wiring 7 is connected to the third electrode 10B. There is provided the insulating layer (the oxide coating 8) disposed on the surface of the wire 3 on the surface of the wire 3 between the wiring 7 and the wire 3, so that insulation between the wiring 7 and the wire 3 can be kept depending on a voltage.

The portion which is not covered with the oxide coating 8 on the surface of the wire 3 can be formed by removing a part of the oxide coating 8 by grounding a part of them after the oxide coating 8 is formed on the surface of the wire 3. A method of forming the part which is not covered with the oxide coating 8 is not limited to the above-described grounding and particularly limited to a publicly-known etching method or the like.

The configuration that the wire 3 is completely put in the groove 2 (namely, the configuration that the upper ends of the surface of the substrate and the wire 3 are aligned or the configuration that the upper end of the wire 3 is lower than the surface of the substrate) is preferable. In other words, it is preferable that the diameter of the wire 3 is not more than the depth of the groove 2. However, the upper end of the wire 3 may be slightly projected from the interior part of the groove 2 (namely, the upper end of the wire 3 is positioned to be higher than the surface of the substrate). In other words, the diameter of the wire 3 may be slightly larger than the depth of the groove 2.

In addition, in the wiring board according to the present invention, as shown in FIGS. 1 to 6, a silicon oxide layer 9 (an insulating layer) also can be arranged on the wire 3 (between the wire 3 and the wiring 7) in addition to the constitutions shown in FIGS. 7 to 9. Thereby, it is possible to improve a dielectric strength voltage between the wiring 7 and the wire 3.

Second Embodiment

Figure 2:
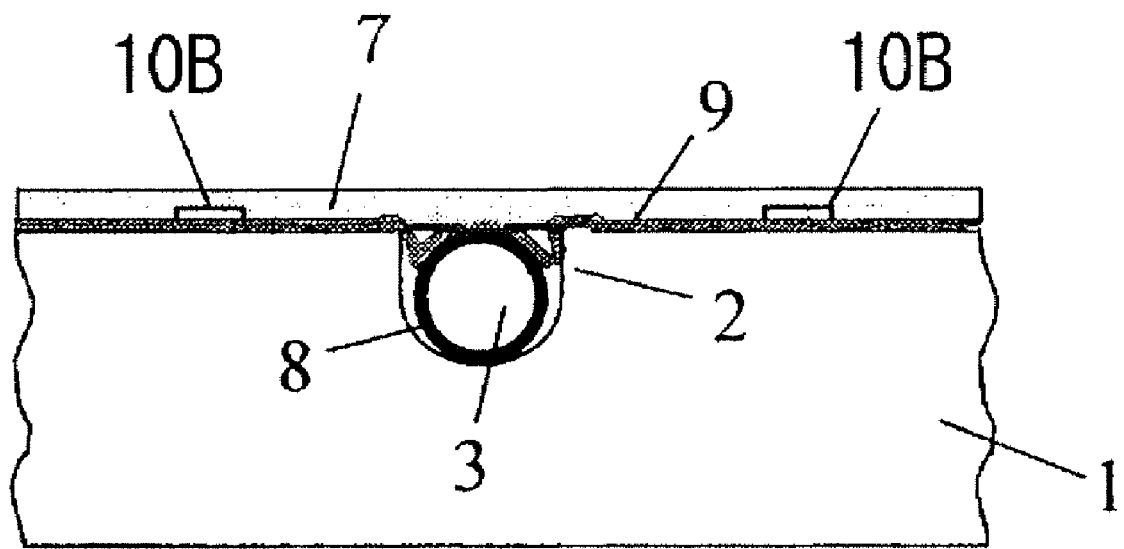
FIG. 2 is a sectional pattern diagram of the matrix wiring structure shown in FIG. 1.

FIG. 1 is a plan pattern diagram of a matrix wiring structure according to the present embodiment. FIG. 2 is a sectional pattern diagram of a matrix wiring structure taken on a line A-A shown in FIG. 1, and FIG. 3 is a sectional pattern diagram of the matrix wiring structure taken on a line B-B shown in FIG. 1.

Figure 3:
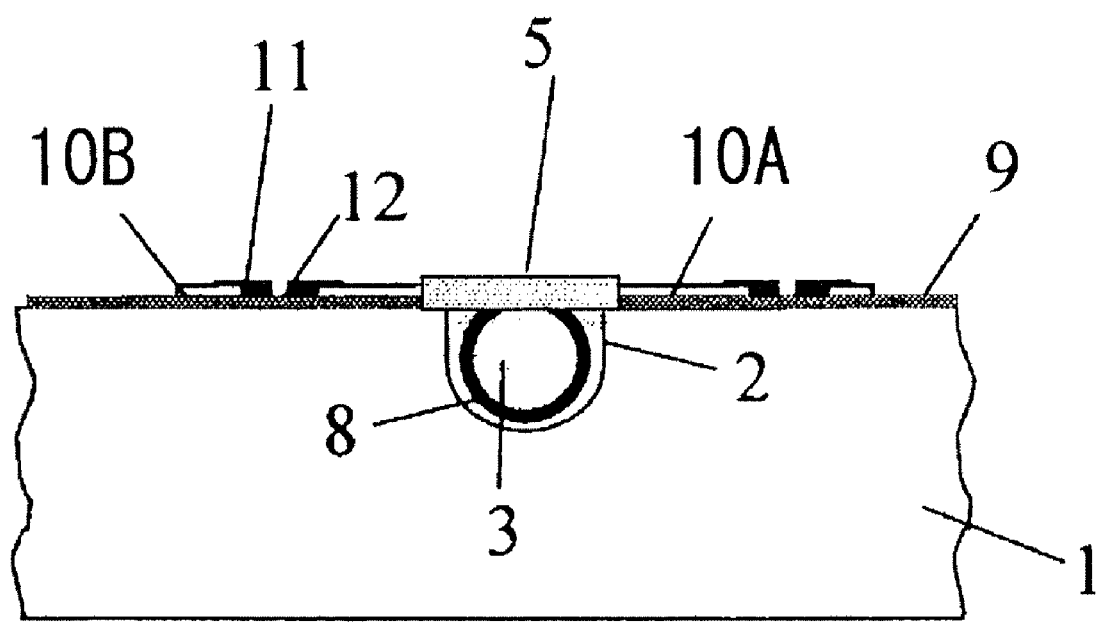
FIG. 3 is a sectional pattern diagram of the matrix wiring structure shown in FIG. 1.

In the configurations shown in FIGS. 1 to 3, the silicon oxide layer 9 is arranged on the surface of the substrate 1 around the wire 3 and the groove 2 (the silicon oxide layer 9 entirely covers the substrate 1 except for the contact portion between the wire 3 and the first electrode 5). Then, the surface conduction electron-emitting device is arranged on the silicon oxide layer 9. According to such a configuration, an adhesive force of the wire 3 to the substrate 1 is improved. In addition, the affect that diffusion of a constituent substance of the substrate 1 is given to an electronic emitting property of the surface conduction electron-emitting device is eased. Further, the dielectric strength voltage between the wiring 7 and the wire 3 is improved.

Third Embodiment

Figure 4:
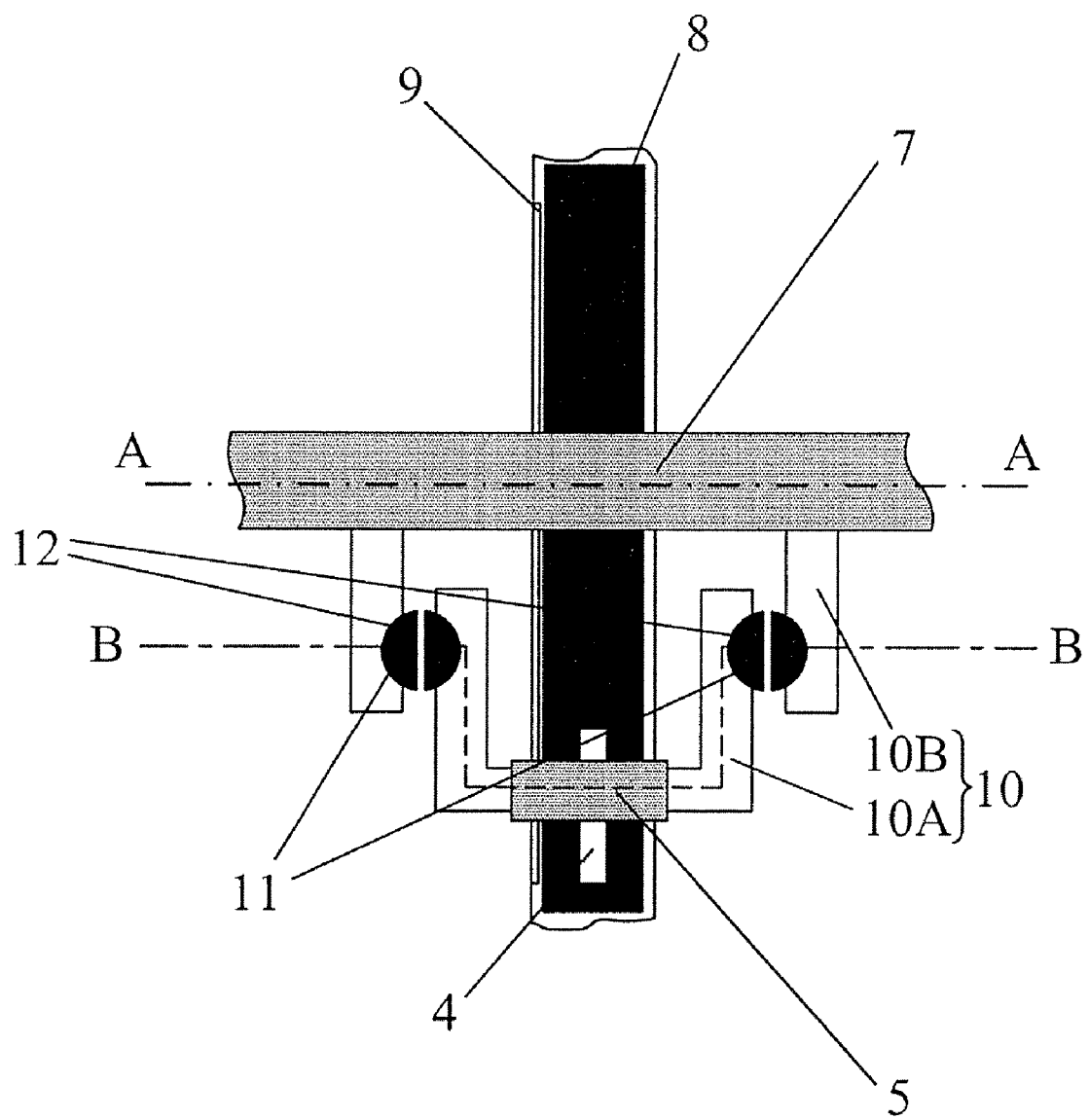
FIG. 4 is a plan pattern diagram of the matrix wiring structure according to a third embodiment.
Figure 5:
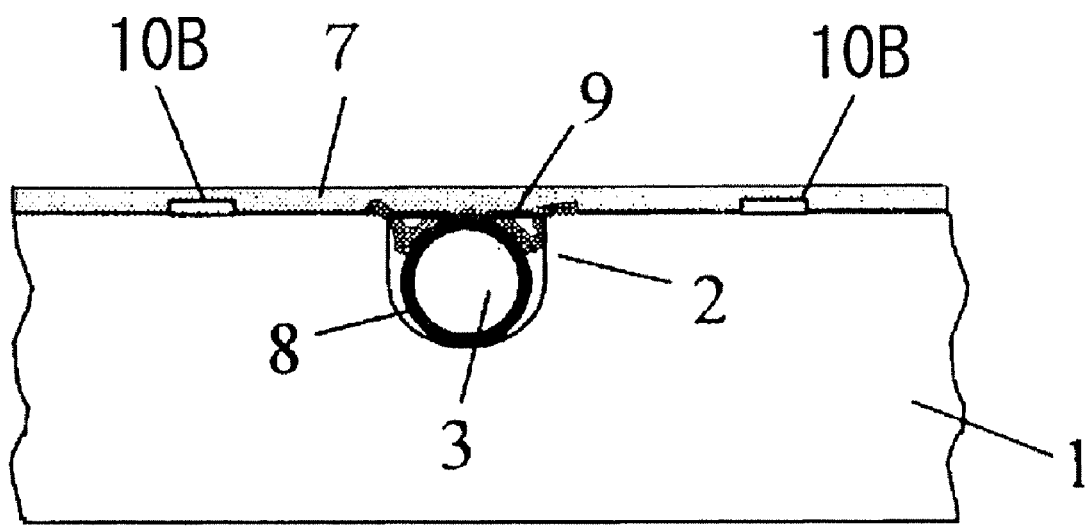
FIG. 5 is a sectional pattern diagram of the matrix wiring structure shown in FIG. 4.

FIG. 4 is a plan pattern diagram of the matrix wiring structure according to the present embodiment. FIG. 5 is a sectional pattern diagram of the matrix wiring structure taken on a line A-A shown in FIG. 4, and FIG. 6 is a sectional pattern diagram of the matrix wiring structure taken on a line B-B shown in FIG. 4.

Figure 6:
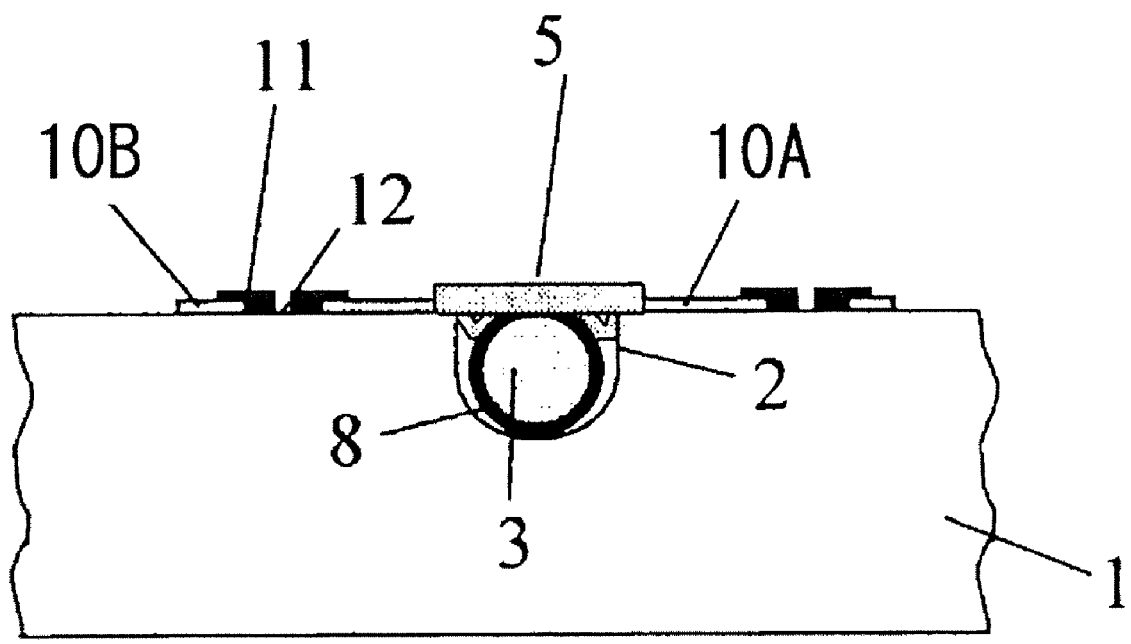
FIG. 6 is a sectional pattern diagram of the matrix wiring structure shown in FIG. 4.

In the configurations shown in FIGS. 4 to 6, as compared to the configurations shown in FIGS. 1 to 3, the silicon oxide layer 9 is arranged on a different place. In the configurations shown in FIGS. 4 to 6, the silicon oxide layer 9 is substantially housed on the groove 2 (the silicon oxide layer 9 entirely covers the groove 2 except for the contact portion between the wire 3 and the first electrode 5). Even in this configuration, it is possible to firmly fix the wire 3 to the substrate 1, and at the same time, the dielectric strength voltage between the wiring 7 and the wire 3 can be improved.

<<Modification Example>>

In the configuration described here, the electron-emitting devices are arranged right and left of one wire 3, however, the electron-emitting device can be arranged only on one side of one wire 3.

<Electron Source>

In addition, it is possible to form an electron source having a plurality of electron-emitting devices arranged in a matrix by disposing a plurality of units shown in FIGS. 1, 4, and 7 on the substrate 1 in a matrix.

<Image Display Apparatus>

Figure 13:
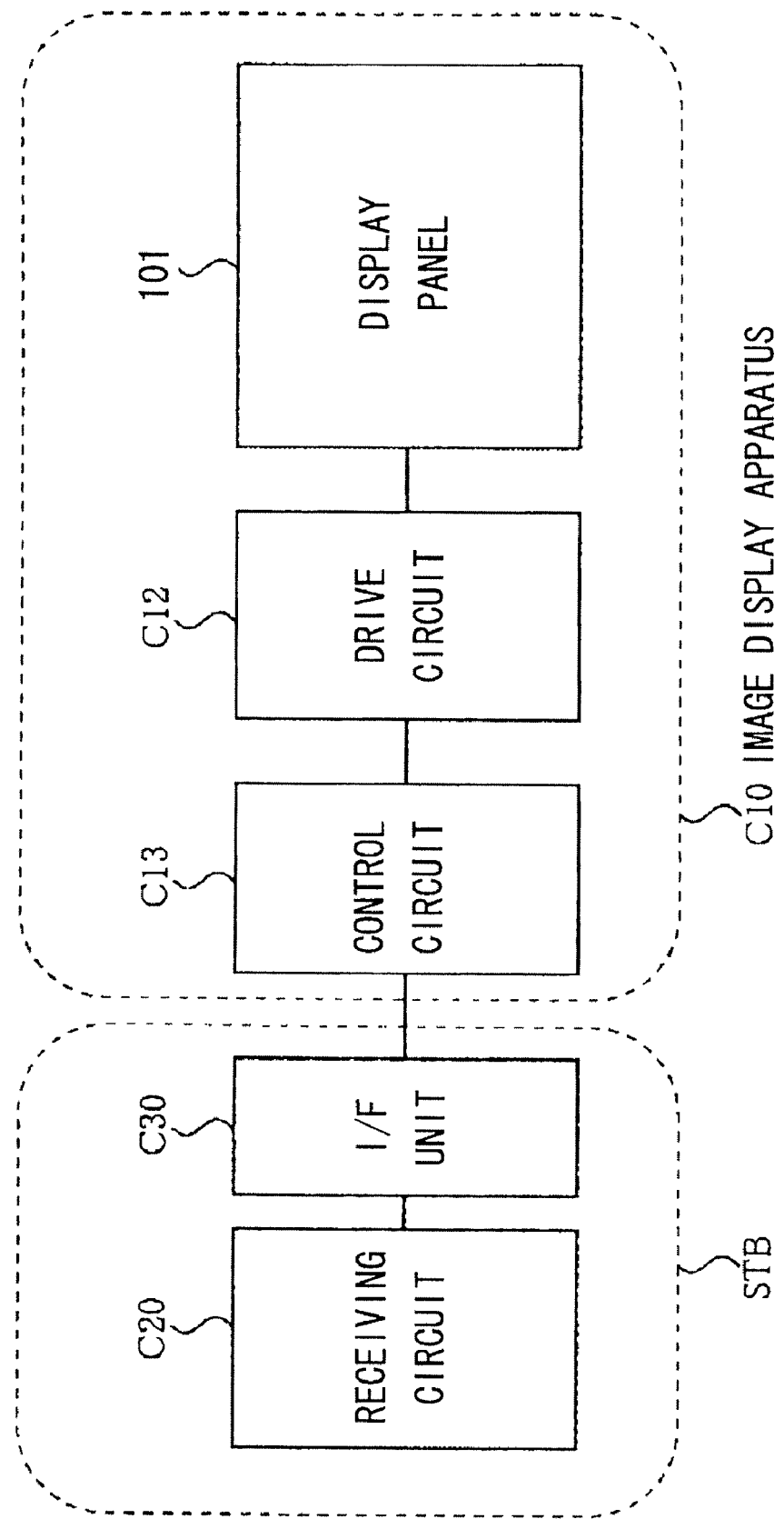
FIG. 13 is a block diagram of a television apparatus according to the embodiment of the present invention.

FIG. 12 shows an example of a display panel 101, which is provided with an electron source having a plurality of electron-emitting devices arranged in a matrix. An X-directional wiring 72 is equivalent to the wire 3 and is a Y-directional wiring 73 is equivalent to the above-described wiring 7. An electron-emitting device 74 is composed of a pair of electrodes 10A and 10B and the conductive film 11 having an interval. A rear plate 71 is equivalent to the above-described substrate 1. A reference numeral 86 denotes a face plate, and a light-emitting member film 84 (equivalent to "a light-emitting member" according to the present invention), which emits a light when an electron ray is irradiated, and an anode electrode 85 are disposed on the surface of a glass substrate 83. A support frame 82 is provided between a rear plate 71 and a face plate 86. A container 88, of which interior part is kept vacuum is composed by the rear plate 71 and the face plate 86. To each of the X-directional wirings 72, terminals (Dox1 to Doxm) are connected, and in the same way, to each of the Y-directional wirings 73, terminals (Doy1 to Doym) are connected. To the anode electrode 85, a terminal 87 to be connected to a high-voltage power supply is connected. As shown in FIG. 13, an image display apparatus C10 is formed by the display panel 101, a drive circuit C12, and a control circuit C13.

<Image Reproducing Apparatus>

In addition, an image reproducing apparatus can be formed by using the display panel 101 of the present embodiment, which has been described with reference to FIG. 12 and a receiver for receiving at least one of a broadcast signal and a signal transmitted via an electric communication line.

Specifically, the image reproducing apparatus is provided with a receiver and a tuner for tuning the received signal so as to output a signal included in the selected signal to the display panel 101 to be displayed or reproduced on a screen. The receiver can receive a broadcast signal such as a TV broadcasting service. In addition, the signal included in the selected signal includes at least one of video information, text information, and audio information. Further, the "screen" is equivalent to the light-emitting member film 84 in the display panel 101 shown in FIG. 12. Based on this constitution, it is possible to form the image reproducing apparatus such as a television set. It is obvious that the image reproducing apparatus according to the present embodiment can include a decoder in the case that the broadcast signal is encoded. The audio signal is reproduced by synchronizing the video information displayed on the display panel 101 with the text information being outputted to audio reproducing means such as a speaker which is separately disposed.

A method of outputting the video information or the text information to the display panel 101 and displaying and/or reproducing them on the screen can be carried out, for example, in the following manner. At first, an image signal in response to each pixel of the display panel 101 is generated from the received video information and text information. Then, the generated image signal is inputted in the drive circuit (C12 of FIG. 13) of the display panel 101. Then, a voltage to be applied to each electron-emitting device in the display panel 101 from the drive circuit based on the image signal inputted in the drive circuit is controlled, and the image is displayed.

<Television Apparatus>

FIG. 13 is a block diagram of a television apparatus, which is an example of the image reproducing apparatus. A receiving circuit C20 is composed of a tuner and a decoder or the like and receives a television signal of a satellite broadcast and a terrestrial broadcast or the like and a data broadcast or the like via an electric communication line such as a radio communication network, a telephone line network, a digital line network, an analog line network, and Internet connected through a TCP/IP protocol or the like and outputs the decoded video data to an I/F unit (interface unit) C30. The I/F unit C30 converts the video data into the image data of a display format of the image display apparatus C10 and outputs it. The image display apparatus C10 includes the display panel 101, the drive circuit C12, and the control circuit C13. The control circuit C13 applies the image processing such as correction processing suitable for the display panel 101 to the inputted image data and outputs the image data and various control signals to the drive circuit C12. The drive circuit C12 outputs the drive signal to the wiring 7 and the wire 3 of the display panel 101 (refer to Dox1 to Doxm and Doy1 to Doyn of FIG. 12) based on the inputted image data, and then, a television image is displayed. The receiver C20 and the I/F unit C30 may be housed in a case different from the image display apparatus C10 as a set top box (STB) or may be housed in the same case as the image display apparatus C10.

In addition, the image reproducing apparatus can be provided with an interface for connecting the image reproducing apparatus to an image recording apparatus or an image output apparatus, such as a printer, a digital video camera, a digital camera, a hard disk drive (HDD), and a digital video disk (DVD). This makes it possible to display the image recorded in the image recording apparatus on the display panel 101. In addition, this makes it possible to process the image displayed on the display panel 101 according to need and to output it to the image output apparatus in the image reproducing apparatus (such as a television).

Here, the constitution of the image reproducing apparatus is merely an example and various modifications are possible based on a technical idea of the present invention. In addition, various image reproducing apparatuses can be formed by connecting the image reproducing apparatus according to the present embodiment to a television conference system and a system such as a computer.

<Manufacturing Method of Wiring Board and Electron Source>

A manufacturing method of a wiring board will be described with reference to FIG. 11 taking an example below.

(Step 1)

Figure 11A:
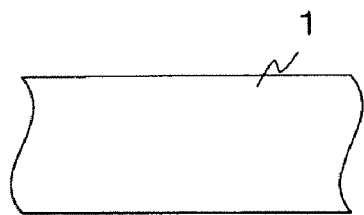
FIGS. 11A to 11I are diagrams showing the manufacturing step of the matrix wiring structure.
Figure 11B:
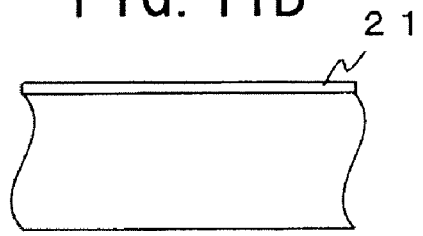

At first, the substrate 1 is prepared, a photosensitive resist 21 is accumulated on the surface of the substrate 1 (FIG. 11A and FIG. 11B).

As the resist 21, a dry film resist (DFR) or a liquid resist is used. Particularly, the dry film resist is preferably used.

(Step 2)

Figure 11C:
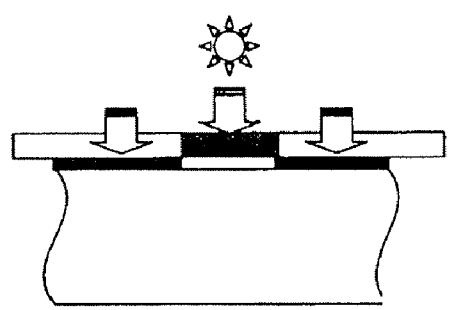
Figure 11D:

Consequently, the resist 21 is exposed and developed according to a photography method so that the portion on which the groove 2 is formed is only exposed (FIG. 11C and FIG. 11D).

(Step 3)

Figure 11E:
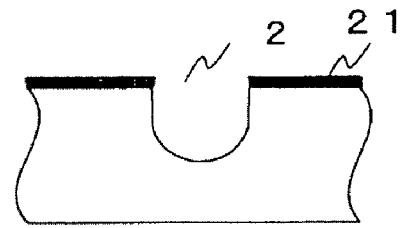

Then, the groove 2 is formed on the surface of the exposed substrate 1 (the portion on which the groove 2 is formed) (FIG. 11E).

As a method for forming the groove 2, a publicly-known method such as a wet etching and a dry etching can be used, however, it is preferable to use a sand blast method.

(Step 4)

Figure 11F:
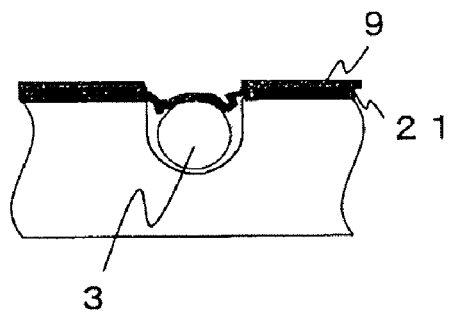

Consequently, the conductive wire 3 is arranged in the groove 2, of which diameter is smaller than the width of the groove 2 (FIG. 11F).

A metal wire can be used as the wire 3, and any one of Al, Cu, and Ni can be preferably used as a metal. As a Cu wire, an oxygen-free copper wire is preferably used, which can control a degree of oxidation.

(Step 5)

Preferably, the silicon oxide layer 9 made of a silicon oxide (typically, $SiO_2$) is disposed so as to cover at least the wire 3 disposed in the groove 2 and the surface of the substrate 1 around the groove 2 (FIG. 11F).

The silicon oxide layer 9 can be formed, for example, by applying a silica sol by means of a slit coater and burning it in an oxygen atmosphere. Further, this step 5 can be omitted.

(Step 6)

Figure 11G:
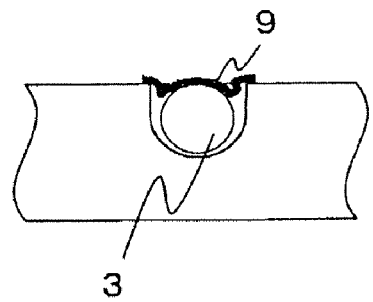

Next, the resist 21 is peeled off (FIG. 11G).

Further, the present step 6 may be effected between the step 3 (FIG. 11E) and the step 4 (FIG. 11F). In other words, removing the resist 21, and then, the wire 3 may be arranged in the groove 2.

In addition, in the case that the resist 21 is removed between the step 3 and the step 4, it is also possible to dispose the silicon oxide layer 9 on the entire surface of the substrate 1. Particularly, in the case that the surface conduction electron-emitting device is disposed on the substrate 1, it is preferable to dispose the silicon oxide layer 9 on the entire surface of the substrate 1 in order to prevent diffusion of an alkaline component from the substrate 1 (refer to FIG. 10G)

(Step 7)

Figure 11H:
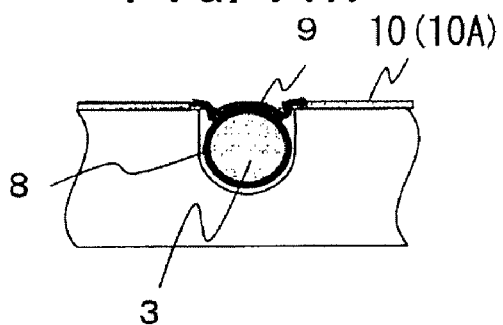

Consequently, the electrode pair 10 (the second electrode 10A, the third electrode 10B) is disposed on the surface of the substrate 1 (FIG. 11H).

The electrode pair 10 can be formed, for example, by disposing a resin film containing a metal forming the electrode pair 10 on the surface of the substrate 1 by a predetermined pattern and heating and burning this resin film in the oxygen atmosphere. As a metal forming the electrode pair 10, for example, platinum can be used. According to the above burning step in the oxygen atmosphere, it is possible to form an oxide coating 8 on the surface of the wire 3.

Here, in the step of forming the electrode pair 10, the oxide coating 8 is formed at the same time, however, formation of the oxide coating 8 is not limited to the present step. In other words, in other step, the oxide coating 8 can be formed on the surface of the wire 3.

For example, the wire 3 provided with the oxide coating 8 in advance is prepared, and this may be arranged in the groove 2 in the step 4 (FIG. 11F). In this way, the method of forming the electrode pair 10 is not particularly limited in the present step 7. Alternatively, in the case of disposing the silicon oxide layer 9, using the burning step in the step 5, the oxide coating 8 with a predetermined thickness can be formed on the surface of the wire 3.

(Step 8)

After that, a part of the oxide coating 8 is removed by means of partial grinding, and a part of the surface of the wire 3 (the contact portion) is exposed in order to connect the wire 3 to the second electrode 10A (formation of the ground portion 4). Here, the ground portion 4 as the contact portion is formed by grinding, however, the present embodiment is not limited to this method. For example, a method of covering the place equivalent to the ground portion 4 of the wire 3 with a protection layer in advance and removing the protection layer after forming the above-described oxide coating 8 or the like can be adopted.

(Step 9)

Figure 11I:
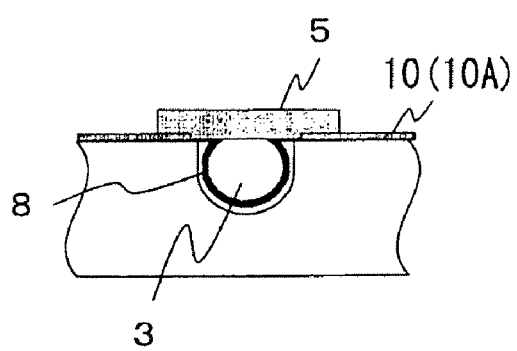

Next, the wiring 7 and the first electrode 5 (the contact electrode) are formed (FIG. 11I). The wiring 7 is formed so as to be electrically connected to the third electrode 10B, and the first electrode 5 is formed so as to be electrically connected to the ground portion 4 of the wire 3 and the second electrode 10A.

A manufacturing method of the wiring 7 and the first electrode 5 is not particularly limited, however, in order to simply form them inexpensively, for example, a method of printing the conductive paste on a predetermined place by the printing method and burning it can be adopted.

According to the above-described steps, an insulating property of the cross portion between the wire 3 and the wiring 7 is secured and a matrix wiring with a simple structure and a low resistance can be formed, which prevents the wiring 7 from projecting from the surface of the substrate 1.

After that, disposing the conductive film 11 is disposed between the electrode pair 10 in order to form a surface conduction electron-emitting device, then, a publicly-known conducting step such as a forming step and activation step is carried out via the wire 3 and the wiring 7. Thus, it is possible to form a good electron source having a high resolution, a little property dispersion, and little change of trajectories of emitted electrons. As one of causes to be able to form a good electron source, it is possible to reduce fluctuation of a voltage to be supplied to each electron-emitting device by using a wire with a low resistance.

In addition, as other cause, it can be considered that the wiring 7 with a high-resolution can be made by arranging the wire 3 in the groove 2 provided on the substrate 1, and an influence of the wiring 7 for the trajectories of emitted electrons can be reduced because a distance between the upper end of the wiring 7 and the surface of the substrate 1 can be made smaller. As an electron-emitting device which can be applied to the present embodiment, a field emission type electron-emitting device using a carbon fiber such as a carbon nano-tube and a metal-insulator-metal type electron-emitting device can be used.

EXAMPLE(S)

The examples according to the present invention will be described below.

First Example

A wire-embedded matrix wiring board shown in FIGS. 1 to 3 is formed by a process shown in a flow chart of FIG. 10.

As the substrate, the glass substrate 1 is used. A dry film resist on the glass substrate 1 is accumulated, and the resist 21 only on the portion forming the groove 2 is solved according to a photolithography method. By using a sand blast method, the groove 2 with a width of about 110 μm and a depth of about 110 μm is formed (FIGS. 10A to 10E). As a groove forming method, the sand blast method or the wet etching are used generally, however, the present example is not limited to these methods.

Figure 10A:
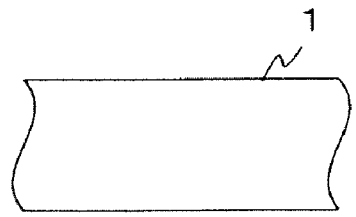
FIGS. 10A to 10I are diagrams showing a manufacturing step of the matrix wiring structure.
Figure 10B:
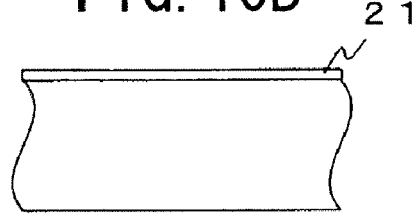
Figure 10C:
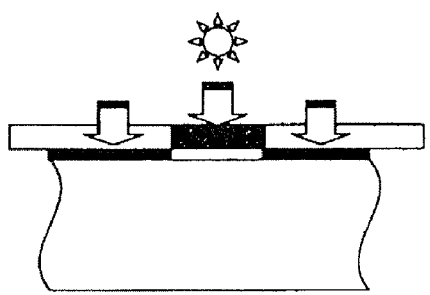
Figure 10D:
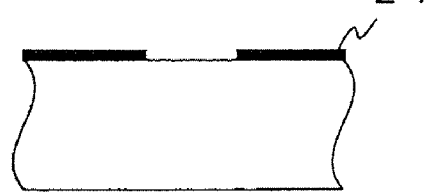
Figure 10E:
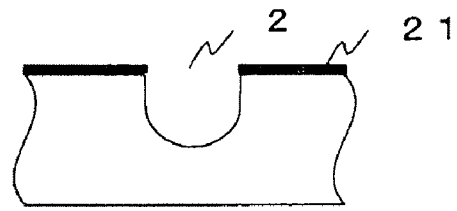
Figure 10F:
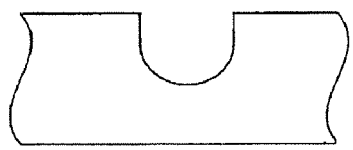

After that, the dry film resist is peeled off (FIG. 10F).

Figure 10G:
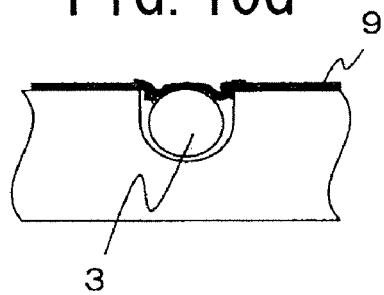
Figure 10H:
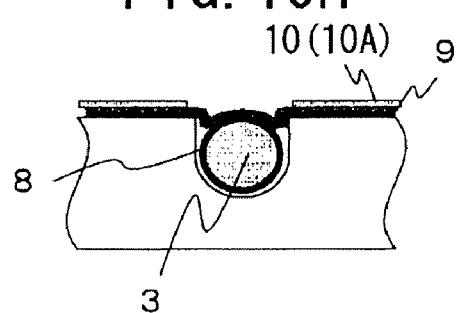

Consequently, the wire 3 made of copper with a diameter of 105 μm is arranged in the groove 2. It is preferable that an oxygen-free copper wire which can control an oxidation degree is used as a Cu wire. Next, a $SiO_2$ film is developed on the entire surface of the glass substrate 1 as the silicon oxide layer 9 by a spattering method (FIG. 10G). A silica-coat material is applied by a slit coater so as to cover the glass substrate 1, the groove 2, and the arranged wire 3, and a silica coating material is temporarily burnt in the air atmosphere at 250° C.

Consequently, by burning the silica coating material in the air atmosphere at 500° C., the electrode pair 10 made of platinum is formed and the oxide coating 8 of 2 μm is formed on the surface of the wire 3. An insulating layer of 3 μm is formed by this oxide coating 8 and the silica coating material covered with the oxide coating 8.

After that, the surface coating of the wire 3 (the oxide coating 8 and the silicon oxide layer 9) is partially removed by a partial grinding in order to manufacture a contact portion between the wire 3 and the second electrode 10A.

Figure 10I:
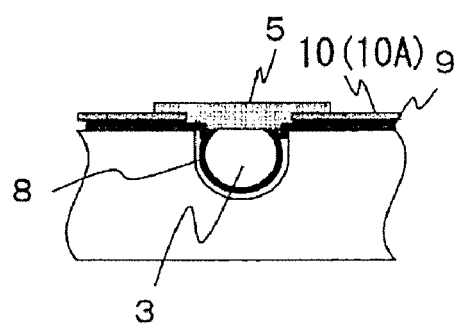

Next, the wiring 7 with a width of 50 μm and a film thickness of 5 μm and a connection pad 5 for connecting the second electrode 10A to the wire 3 are formed by using the printing method by using an Ag paste, and burned at 500° C., and thereby the wiring board is completed (FIG. 10I). As a result, it is confirmed that insulation is kept on the cross portion between the wire 3 and the wiring 7.

Second Example

The processing till formation of the groove 2 and peeling-off of the dry film resist (FIGS. 10A to 10F) will be effected as same as the first example. Next, the wire 3 having the oxide coating 8 of 3 μm on its surface, which is formed by heating the wire in the air atmosphere in advance, is arranged in the groove 2. Then, the silica coating material of 2 μm by a slit coater is applied so as to cover the glass substrate 1, the groove 2, and the arranged wire 3, the silica coating material is temporarily burned in the air atmosphere so as to form the silicon oxide layer 9. Consequently, the electrode pair 10 made of platinum is obtained by air-burning it at 500° C. Then, an insulating layer of 5 μm is formed by the oxide coating 8 and the silicon oxide layer 9. Next, the wiring 7 is formed by the printing method by using the Ag paste, the connection pad 5 for connecting the second electrode 10A to the wire 3 is printed at the same time, they are burned at 500° C., and thereby the wiring board is completed. As a result, it is confirmed that insulation is kept on the cross portion between the wire 3 and the wiring 7.

Third Example

The wiring board provided with the matrix wiring shown in FIGS. 4 to 6 is formed in a step flow of FIG. 11.

The processing till formation of the groove 2 is carried out as same as the first example and leaving the dry film resist, the wire 3 is arranged in the groove 2 (FIG. 11F). Next, the silica coating material of 2 μm by a slit coater is applied so as to cover the groove 2 and the arranged wire 3, the silica coating material is temporally burned at 250° C. in an atmosphere so as to form the silicon oxide layer 9. After that, the dry film resist is peeled off (FIG. 11G).

Consequently, the electrode pair 10 made of platinum is obtained by air-burning an organic platinum film at 500° C., and the oxide coating 8 of 2 μm is formed on the surface of the wire 3 (FIG. 11H). The insulating layer of 4 μm is formed by the oxide coating 8 and the silicon oxide layer 9 covered with the oxide coating 8.

Next, the wiring 7 is formed by the printing method by using the Ag paste, the connection pad 5 for connection between the second electrode 10A and the wire 3 is printed at the same time, they are burned at 500° C., and thereby the wiring board is completed. As a result, it is confirmed that insulation is kept on the cross portion between the wire 3 and the wiring 7.

Fourth Example

The wiring board provided with the matrix wiring shown in FIGS. 7 to 9 is formed.

As same as the first example, the groove 2 is formed, and after that, the electrode pair 10 is formed. Then, after the wire 3 in the groove 2 is arranged, the connection pad 5 for connection between the second electrode 10A and the wire 3 are printed by using a screen printing method, and burning is made at 500° C. Thereby, the wire 3 is firmly fixed to the glass substrate 1 by the connection pad (the first electrode) 5 and the oxide coating 8 of 2 μm is formed on the surface of the wire 3.

Next, the wiring 7 according to the printing method is formed by using the Ag paste, and burning is made at 500° C. so as to complete the matrix substrate. As a result, it is confirmed that insulation is kept on the cross portion between the wire 3 and the wiring 7.

In addition, using the wiring board formed by the above-described respective examples, the conductive film 11 is disposed between the electrode pair 10 and then, a publicly-known forming step and activating step are carried out by conducting the conductive film 11 via the wiring 7 and the wire 3 so as to form a surface conduction electron-emitting device. After that, the image display apparatus shown in FIG. 12 and FIG. 13 is formed, and it is possible to display a good image with a high resolution and high uniformity.

As described above, if the wiring board is manufactured by formation of an insulating layer using oxidation in air-burning according to the present example, the matrix wiring structure with a high resolution can be formed with a low cost from a material side and a process side, and an excellent display panel can be formed.

While the present invention has been described with reference to exemplary embodiments, it is to be understood that the invention is not limited to the disclosed exemplary embodiments. The scope of the following claims is to be accorded the broadest interpretation so as to encompass all such modification and equivalent structures and functions.

This application claims the benefit of Japanese Patent Application No. 2006-183699, filed on Jul. 3, 2006, which is hereby incorporated by reference herein in its entirety.

What is claimed is:

1. An electron source comprising:
   a wiring board including:
      a substrate having a groove on its surface;
      a conductive wire containing a metal which is arranged along the groove in the groove; and
      a wiring which is arranged above the wire crossing the wire; and
      a plurality of electron-emitting devices arranged on the wiring board and electrically connected to the metal contained in the wire and the wiring;
   wherein the wire has an oxide layer of the metal contained in the wire on its surface, and wherein
   an opening to electrically connect the metal contained in the wire and the electron-emitting device is formed in a portion of the oxide layer.

2. An electron source according to claim 1,
   wherein the metal contained in the wire is any one of Cu, Ni, and Al.

3. An image display apparatus comprising:
   an electron source; and
   a light-emitting member for emitting a light by irradiation with electrons emitted from the electron source, wherein
   the electron source is an electron source according to claim 1.

4. An image reproducing apparatus comprising:
   a receiver for receiving at least one of a broadcast signal and a signal transmitted via an electric communication line; and
   an image display apparatus which is connected to the receiver, wherein,
   the image display apparatus is an image display apparatus according to claim 3.

5. A wiring board comprising:
   a substrate having a groove on its surface;
   a conductive wire containing a metal which is arranged along the groove in the groove; and
   a wiring which is arranged above the wire crossing the wire;
   wherein the wire has an oxide layer of the metal contained in the wire on its surface, and wherein
   an opening to electrically connect the metal contained in the wire and a device arranged on the wiring board, and wherein
   the oxide layer is arranged at least between the wiring and the wire and between the wire and an inner wall of the groove.

6. A wiring board according to claim 5,
   wherein the metal contained in the wire is any one of Cu, Ni, and Al.

7. A manufacturing method of a wiring board which has a substrate having a groove on its surface and a conductive wire arranged along the groove in the groove, comprising the steps of:
   arranging a conductive wire containing a metal, of which surface is oxidized in advance, along the groove in the groove; and
   forming an opening to electrically connect the metal contained in the wire and a device arranged on the wiring board in a portion of an oxide layer on a surface of the wire.

8. A manufacturing method of a wiring board according to claim 7, further having a step of forming a wiring crossing the wire above the wire by a printing method.

9. A manufacturing method of a wiring board which has a substrate having a groove on its surface and a conductive wire arranged along the groove in the groove, comprising the steps of:
   arranging a conductive wire containing a metal in the groove; and
   oxidizing the surface of the wire forming an opening to electrically connect the metal contained in the wire and a device arranged on the wiring board in a portion of an oxide layer on a surface of the wire.

10. A manufacturing method of a wiring board according claim 9, further having a step of forming a wiring crossing the wire above the wire by a printing method.

11. An electron source comprising:
   a wiring board including:
      a substrate having a groove on its surface;
      a conductive wire containing a metal which is arranged along the groove in the groove; and
      a wiring which is arranged above the wire crossing the wire; and a plurality of electron-emitting devices arranged on the wiring board and electrically connected to the metal contained in the wire and the wiring; wherein the wire has an oxide layer of the metal contained in the wire on its surface, and wherein the oxide layer and the wiring contact each other.

12. An electron source according to clam 11, wherein the metal contained in the wire is any one of Cu, Ni, and Al.

13. An image display apparatus comprising:

an electron source; and a light-emitting member for emitting a light by irradiation with electrons emitted from the electron source, wherein the electron source is an electron source according to claim 11.

14. An image reproducing apparatus comprising:

a receiver for receiving at least one of a broadcast signal and a signal transmitted via an electric communication line; and an image display apparatus which is connected to the receiver, wherein the image display apparatus is an image display apparatus according to claim 13.

* * * * *